(12) United States Patent
Ku et al.

(10) Patent No.: US 10,020,402 B2
(45) Date of Patent: Jul. 10, 2018

(54) THIN FILM TRANSISTOR AND METHOD OF MANUFACTURING OF THE SAME

(71) Applicant: SAMSUNG DISPLAY CO., LTD., Yongin, Gyeonggi-Do (KR)

(72) Inventors: Suk Hoon Ku, Yongin (KR); Hyunduck Cho, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 104 days.

(21) Appl. No.: 14/637,224

(22) Filed: Mar. 3, 2015

(65) Prior Publication Data

US 2016/0043233 A1     Feb. 11, 2016

(30) Foreign Application Priority Data

Aug. 7, 2014   (KR) .................. 10-2014-0101792

(51) Int. Cl.

| H01L 29/786 | (2006.01) |
|---|---|
| H01L 29/423 | (2006.01) |
| H01L 29/66  | (2006.01) |
| H01L 29/417 | (2006.01) |

(52) U.S. Cl.
CPC .. *H01L 29/78609* (2013.01); *H01L 29/41733* (2013.01); *H01L 29/42384* (2013.01); *H01L 29/66757* (2013.01); *H01L 29/78618* (2013.01)

(58) Field of Classification Search
None
See application file for complete search history.

(56) References Cited

U.S. PATENT DOCUMENTS

| 5,567,958  | A  | * | 10/1996 | Orlowski ............ H01L 27/1108 257/330 |
| 6,274,894  | B1 |   | 8/2001  | Wieczorek et al. |
| 6,346,439  | B1 |   | 2/2002  | Ahmad et al. |
| 6,362,063  | B1 |   | 3/2002  | Maszara et al. |
| 6,391,728  | B1 |   | 5/2002  | Yu |
| 6,426,278  | B1 |   | 7/2002  | Nowak et al. |
| 6,975,014  | B1 | * | 12/2005 | Krivokapic ....... H01L 29/42384 257/506 |
| 7,419,858  | B2 | * | 9/2008  | Schuele ............ H01L 29/66621 257/E21.413 |
| 2006/0220085 | A1 | * | 10/2006 | Huo ...................... H01L 27/108 257/296 |
| 2009/0053869 | A1 | * | 2/2009  | Hirler ................ H01L 21/2815 438/270 |

FOREIGN PATENT DOCUMENTS

| KR | 2000-0034640 A | 6/2000 |
| WO | WO 2006/083546 A2 | 8/2006 |

\* cited by examiner

*Primary Examiner* — Shaun Campbell
*Assistant Examiner* — Aneta Cieslewicz
(74) *Attorney, Agent, or Firm* — Lewis Roca Rothgerber Christie LLP (57) ABSTRACT

Provided are a thin film transistor (TFT) and a method of manufacturing the TFT. The TFT includes a substrate; a first conductive type semiconductor layer on the substrate and having a recess; second conductive type spacers at opposite side walls in the recess; a main semiconductor layer covering the first conductive type semiconductor layer and the second conductive type spacers and comprising a channel region and source and drain regions; a gate insulating layer on the main semiconductor layer; and a gate electrode on the gate insulating layer and corresponding to the recess.

17 Claims, 6 Drawing Sheets

THIN FILM TRANSISTOR AND METHOD OF MANUFACTURING OF THE SAME

CROSS-REFERENCE TO RELATED APPLICATION

This application claims priority to and the benefit of Korean Patent Application No. 10-2014-0101792, filed on Aug. 7, 2014 in the Korean Intellectual Property Office, the disclosure of which is incorporated herein in its entirety by reference.

BACKGROUND

1. Field

One or more embodiments of the present invention relate to a thin film transistor (TFT) and a method of manufacturing the TFT.

2. Description of the Related Art

Recently, as the degree of integration in semiconductor devices has increased, the size of transistors has been reduced, improving an operating speed and reducing the size of the semiconductor devices. Such a reduction in the size of transistors may facilitate a reduction in a channel length of the transistors and an increase in switching speed of the transistors. However, the reduction in the channel length may generate a short-channel effect. The short-channel effect may include variation in a threshold voltage, excessive drain current leakage, a punch through, and drain induced barrier lowering (DIBL).

SUMMARY

Various technologies are provided to control the short-channel effect. For example, a halo region may be used in a thin film transistor (TFT) for reducing the short-channel effect.

The halo region is a high-concentration doping region disposed between source/drain regions and a channel region and reduces lateral diffusion of dopant from the source and drain regions to the channel region to restrain (e.g., reduce) the short-channel effect.

One or more embodiments of the present invention include a thin film transistor (TFT) including a halo region and a method of manufacturing the TFT including the halo region.

Additional aspects of one or more embodiments of the present invention will be set forth in part in the description which follows and, in part, will be apparent from the description or may be learned by practice of the presented embodiments.

According to one or more embodiments of the present invention, a thin film transistor (TFT) includes: a substrate; a first conductive type semiconductor layer on the substrate and having a recess; second conductive type spacers at opposite side walls in the recess; a main semiconductor layer covering the first conductive type semiconductor layer and the second conductive type spacers, the main semiconductor layer including a channel region and source and drain regions; a gate insulating layer on the main semiconductor layer; and a gate electrode on the gate insulating layer and corresponding to the recess.

The channel region may be between the second conductive type spacers in the recess.

The source and drain regions may be on an upper surface of the first conductive type semiconductor layer.

An upper surface of the gate electrode may be at a level substantially equal to an upper surface of the gate insulating layer.

A thickness of the gate electrode at a center portion of the recess may be greater than the thickness of the gate electrode nearer the side walls of the recess.

The second conductive type spacers may form a halo region.

The recess may expose a portion of the substrate.

According to one or more embodiments of the present invention, a method of manufacturing a thin film transistor (TFT) includes: forming a first conductive type semiconductor layer on the substrate, the first conductive type semiconductor layer having a recess; forming second conductive type spacers at opposite side walls in the recess; forming a main semiconductor layer to cover the first conductive type semiconductor layer and the second conductive type spacers; forming a gate insulating layer on the main semiconductor layer; and forming a gate electrode on the gate insulating layer and corresponding to the recess.

The forming of the first conductive type semiconductor layer may include: forming a preliminary first conductive type semiconductor layer while performing an in-situ doping process adding a first conductive type dopant; and forming the recess in the preliminary first conductive type semiconductor layer.

The forming of the second conductive spacers may include: forming a preliminary second conductive type semiconductor layer on an entire surface of the substrate to cover the first conductive semiconductor layer; and exposing a portion of a bottom face of the recess by dry etching the preliminary second conductive type semiconductor layer.

The preliminary second conductive type semiconductor layer may be doped with a second conductive type dopant during an in-situ doping process.

The method may further include: forming an etch stop layer on an upper surface of the first conductive type semiconductor layer; and removing the etch stop layer after forming the second conductive type spacers.

The forming of the gate electrode may include: forming a preliminary gate electrode layer on the gate insulating layer; and planarizing the preliminary gate electrode layer to expose a portion of the gate insulating layer.

The second conductive type spacers or the gate electrode may be self-aligned by the recess.

The main semiconductor layer may include a channel region and source and drain regions, the channel region may be formed in the recess, and the source and drain regions may be formed on the upper surface of the first conductive type semiconductor layer.

The source and drain regions may be formed by implanting a first conductive type dopant into the main semiconductor layer by using the gate electrode as a mask.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the presented embodiments may have different forms and should not be construed as being limited to the descriptions set forth herein. Accordingly, the embodiments are merely described below, by referring to the figures, to explain aspects of embodiments of the present invention.

Hereinafter, the present invention will be described in detail by explaining exemplary embodiments of the invention with reference to the attached drawings.

It will be understood that although the terms "first", "second", etc. may be used herein to describe various components, these components should not be limited by these terms. These terms are only used to distinguish one component from another.

As used herein, the singular forms "a," "an", and "the" are intended to include the plural forms as well, unless the context clearly indicates otherwise.

It will be further understood that the terms "includes", "including", "comprises", and/or "comprising" used herein specify the presence of stated features or components but do not preclude the presence or addition of one or more other features or components.

It will be understood that when a layer, region, or component is referred to as being "on" or "formed on" another layer, region, or component, it can be directly or indirectly formed on the other layer, region, or component. That is, for example, intervening layers, regions, or components may also be present. Further, when a first element is described as being "coupled" or "connected" to a second element, the first element may be directly coupled or connected to the second element or the first element may be indirectly coupled or connected to the second element via one or more intervening elements. Sizes or thicknesses of layers and/or components in the drawings may be exaggerated for convenience of explanation. In other words, because sizes and thicknesses of components and/or layers in the drawings are arbitrarily illustrated for convenience of explanation, the following embodiments are not limited thereto.

In the following embodiments, the x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items. Expressions such as "at least one of," when preceding a list of elements, modify the entire list of elements and do not modify the individual elements of the list.

Figure 1:
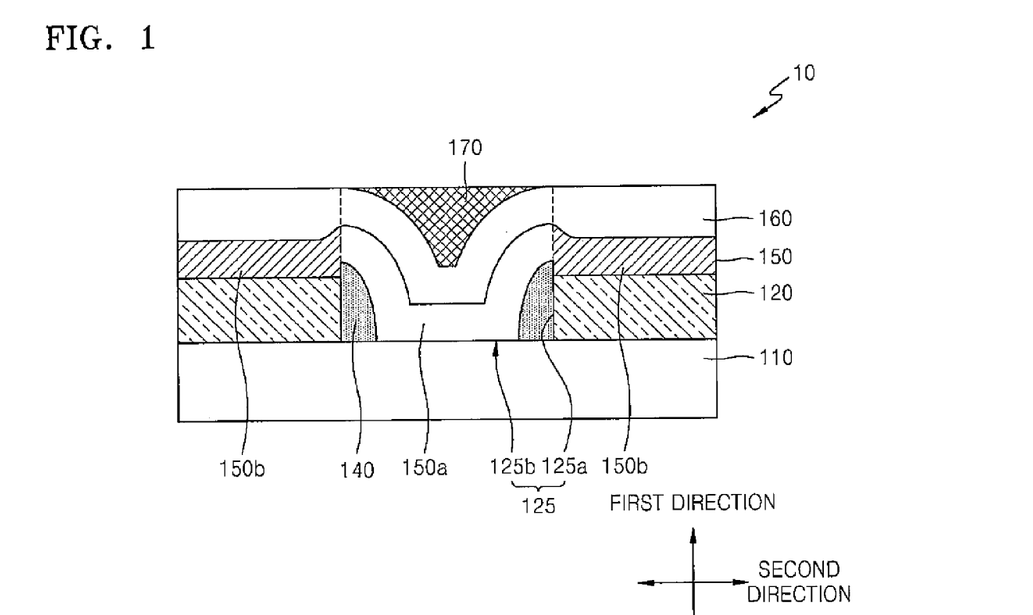
FIG. 1 is a schematic cross-sectional view of a thin film transistor (TFT) according to an embodiment of the present invention.

FIG. 1 is a cross-sectional view of a thin film transistor (TFT) 10 according to an embodiment of the present invention.

The TFT 10 includes a substrate 110, a first conductive type semiconductor layer 120, second conductive type spacers 140, a main semiconductor layer 150, a gate insulating layer 160, and a gate electrode 170.

The substrate 110 may be formed using a thin film growth process and may be formed of, for example, silicon (Si), silicon carbide (SiC), sapphire ($Al_2O_3$), GaN, and/or $Ga_2O_3$. Also, the substrate 110 may be a silicon-on-insulator (SOI) substrate. When the substrate 110 is formed of Si, the substrate 110 may be doped with a p-type or an n-type dopant. The p-type dopant may include, for example, at least one selected from the group consisting of B, Al, Mg, Ca, Zn, Cd, Hg, and Ga, and the n-type dopant may include, for example, at least one selected from the group consisting of As, P, and Sb.

A core growth layer and/or various buffer layers may be formed between the substrate 110 and the first conductive type semiconductor layer 120 in order to reduce or prevent crystal defects caused by discordance between a lattice constant and a thermal expansion coefficient.

The first conductive type semiconductor layer 120 is disposed on the substrate 110 and has a recess 125. A part (e.g., a portion) of a layer disposed under the first conductive type semiconductor layer 120 may be exposed through the recess 125. For example, a part (e.g., a portion) of the substrate 110 may be exposed through the recess 125.

The first conductive type semiconductor layer 120 denotes a semiconductor layer having the first conductive type, and the first conductive type may be the p-type or the n-type. The first conductive type semiconductor layer 120 may be formed of a semiconductor material including amorphous silicon or crystalline silicon. In this embodiment, the crystalline silicon may be formed by crystallizing the amorphous silicon. The amorphous silicon may be crystallized by using a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method. The crystalline silicon may be grown by an epitaxial growth method. One or more of these semiconductor growth methods are performed in a suitable growth chamber as those skilled in the art would appreciate.

The first conductive semiconductor layer 120 may have the conductive type of the dopant type that is added (e.g., a p-type dopant or an n-type dopant). The p-type or n-type dopant may be added by an in-situ doping operation. The in-situ doping may denote adding a dopant material during forming the first conductive type semiconductor layer 120. For example, a gas including a dopant may be injected into a growth chamber while growing the semiconductor layer using the epitaxial growth method, and thus, the dopant may be in the semiconductor layer.

The first conductive type semiconductor layer 120 may function as source and drain regions (e.g., source and drain regions 150b) of the main semiconductor layer 150.

The second conductive type spacers 140 are disposed at opposite side walls 125a in the recess 125. Accordingly, two second conductive type spacers 140 are formed in the recess 125 at opposite side walls of the recess 125, and a channel region 150a of the main semiconductor layer 150 is disposed between the two second conductive type spacers 140. The second conductive type spacers 140 have a different conductive type than that of the first conductive type semiconductor layer 120. For example, when the first conductive type semiconductor layer 120 is the p-type, the second conductive type spacers 140 may be the n-type. In addition, when the first conductive type semiconductor layer 120 is the n-type, the second conductive type spacers 140 may be the p-type.

The second conductive type spacers 140 may be formed of a semiconductor material including amorphous silicon or crystalline silicon. The second conductive type spacers 140 may have the conductive type (e.g., may be doped) through an in-situ doping process.

Each of the second conductive type spacers 140 may form a halo region. The halo region is a doped region disposed between the channel region and the source and drain regions, respectively, and having a non-uniform doping profile along a side surface direction of the substrate (e.g., a second direction or a direction parallel to a surface of the substrate). The halo regions reduce lateral diffusion of the dopant from the source and drain regions to the channel region, thereby restraining or reducing a short-channel effect.

The doping profile may be adjusted or varied according to (e.g., by adjusting or varying) conditions of a deposition process of the second conductive type spacers 140 and/or conditions of the in-situ doping process. In some embodiments, the doping profile may show the highest doping concentration at or near a center of each of the spacers and a gradually reduced doping concentration toward edges of each spacer along the second direction shown in FIG. 1. In another embodiment, the doping profile may show the highest doping concentration of each of the spacers nearest a center of the recess and a gradually reduced doping concentration toward an edge of each respective spacer at a sidewall of the recess.

The main semiconductor layer 150 covers the first conductive type semiconductor layer 120 and the second conductive type spacers 140. The main semiconductor layer 150 includes the channel region 150a and the source and drain regions 150b. The main semiconductor layer 150 may be formed of a semiconductor material including amorphous silicon or crystalline silicon.

The channel region 150a may be formed in the recess 125, and the channel region 150a may be disposed to contact the second conductive type spacers 140. The channel region 150a may not be doped or may be slightly doped.

The source and drain regions 150b extend from the channel region 150a (e.g., extend in the second direction) and may be disposed on an upper surface of the first conductive type semiconductor layer 120. The source and drain regions 150b may have the same conductive type as that of the first conductive type semiconductor layer 120. Accordingly, the source and drain regions 150b of the main semiconductor layer 150 and the first conductive type semiconductor layer 120 may be (e.g., may perform as) source and drain regions of the TFT 10.

The gate insulating layer 160 is disposed on the main semiconductor layer 150 to insulate the main semiconductor layer 150 and the gate electrode 170 from each other. The gate insulating layer 160 may have a single-layer structure of an organic or inorganic material or a stacked structure (e.g., a multi-layer structure) including an organic material and/or an inorganic material. In some embodiments, the gate insulating layer 160 may include silicon nitride ($SiN_x$) and/or silicon oxide ($SiO_x$).

The gate electrode 170 is disposed on the gate insulating layer 160 to correspond to (e.g., to be in or over) the recess 125. Accordingly, the gate electrode 170 may be disposed to correspond to (e.g., to be aligned with or be over) the channel region 150a. The channel region 150a and the gate electrode 170 may be self-aligned with each other due to the recess 125.

A level of an upper surface of the gate electrode 170 may be substantially equal to that of an upper surface of the gate insulating layer 160 (e.g., the upper surface of the gate electrode 170 and the upper surface of the gate insulating layer 160 may form a substantially flat surface). In some embodiment, a distance from an upper surface of the gate electrode to the substrate may be substantially equal to a distance from an upper surface of the gate insulating layer to the substrate. A thickness of the gate electrode 170 may be reduced gradually from a center portion of the recess 125 toward edges (e.g., sides or sidewalls) of the recess 125.

The gate electrode 170 may be formed of a conductive material. For example, the gate electrode 170 may include metal, a metal alloy, a conductive metal oxide, or a conductive metal nitride. For example, the gate electrode 170 may include at least one selected from aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), zirconium (Zr), indium tin oxide (ITO), and zinc oxide (ZnO). The gate electrode 170 may have a single-layer or multilayer (e.g., stacked) structure.

As described above, the TFT 10 according to one or more embodiments of the present invention may include a halo region through an in-situ doping process. Also, the TFT 10 has the recess 125, and thus, the second conductive type spacers 140, the channel region 150a, and the gate electrode 170 forming the halo region may be self-aligned.

FIGS. 2a through 2j are cross-sectional views sequentially illustrating a method of manufacturing the TFT 10 according to an embodiment of the present invention.

Figure 2A:
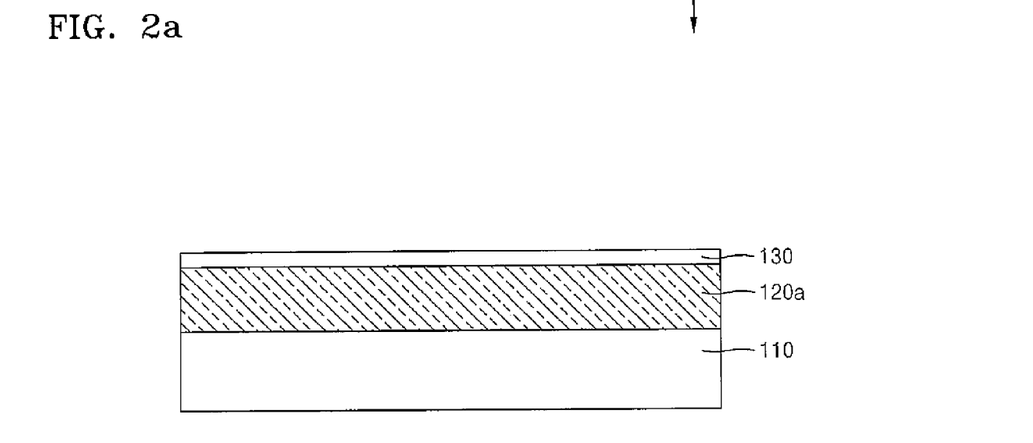
FIGS. 2A through 2J are cross-sectional views illustrating a method of manufacturing a TFT according to an embodiment of the present invention.

Referring to FIG. 2a, a preliminary first conductive type semiconductor layer 120a and an etch stop layer 130 are sequentially formed on the substrate 110. The forming of the etch stop layer 130 may be omitted, if desired.

The preliminary first conductive type semiconductor layer 120a may be formed of amorphous silicon or crystalline silicon. The preliminary first conductive type semiconductor layer 120a may be formed by various methods known as compound semiconductor growth methods. For example, an epitaxial deposition method, a metal organic chemical vapor deposition (MOCVD) method, a hydride vapor phase epitaxy (HVPE) method, a molecular beam epitaxy (MBE) method, a metal organic vapor phase epitaxy (MOVPE) method, and/or a halide chemical vapor deposition (HCVD) method may be used. Also, the crystalline silicon may be formed by crystallizing the amorphous silicon.

When the preliminary first conductive type semiconductor layer 120a is formed, an in-situ doping operation for adding a first conductive type dopant may be performed concurrently (e.g., simultaneously). For example, a gas containing the first conductive type dopant may be injected into the semiconductor growth chamber while growing the preliminary first conductive type semiconductor layer 120a to perform the doping operation.

The first conductive type may be the p-type or the n-type. The p-type dopant may include at least one selected from the group consisting of B, Al, Mg, Ca, Zn, Cd, Hg, and Ga, and the n-type dopant may include at least one selected from the group consisting of As and P.

Various buffer layers may be formed between the substrate 110 and the preliminary first conductive type semiconductor layer 120a in order to reduce a difference between the lattice constants and the thermal expansion coefficients so as to reduce degradation in crystallizing property of the preliminary first conductive type semiconductor layer 120a. The buffer layers may be formed by using various methods known as compound semiconductor growth methods.

The etch stop layer 130 is formed on the preliminary first conductive type semiconductor layer 120a and may be used as an etch stopper when a preliminary second conductive type semiconductor layer 140a is patterned for forming the second conductive type spacers 140 that will be further described later.

The etch stop layer 130 may include a single-layer or multi-layer structure including an inorganic insulating material. In some embodiments, the etch stop layer 130 may be formed of $SiN_x$, $SiO_2$, hafnium oxide ($HfO_x$), or aluminum oxide ($AlO_x$). The etch stop layer 130 may be formed by various deposition methods, such as a chemical vapor deposition (CVD) method or a plasma enhanced chemical vapor deposition (PECVD) method.

Figure 2B:
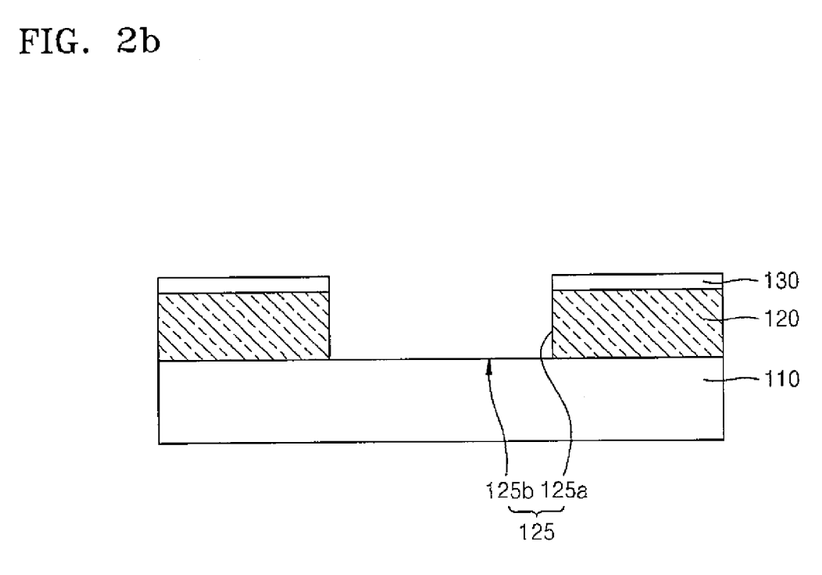

Referring to FIG. 2b, the recess 125 is formed in the preliminary first conductive type semiconductor layer 120a to form the first conductive type semiconductor layer 120.

The recess 125 includes side walls 125a and a bottom face 125b therein. A part of the substrate 110 (e.g., a portion of the substrate 110) may be exposed via the recess 125. In this embodiment, the bottom face 125b of the recess 125 may be the upper surface of the substrate 110.

A photolithography and an etching process using a mask may be performed to form the recess 125. The etching process may be performed by a dry etching process, a wet etching process, or a combination thereof.

The second conductive type spacers 140, the channel region 150a, and the gate electrode 170, that will be further described later, may be self-aligned by the recess 125.

Figure 2C:
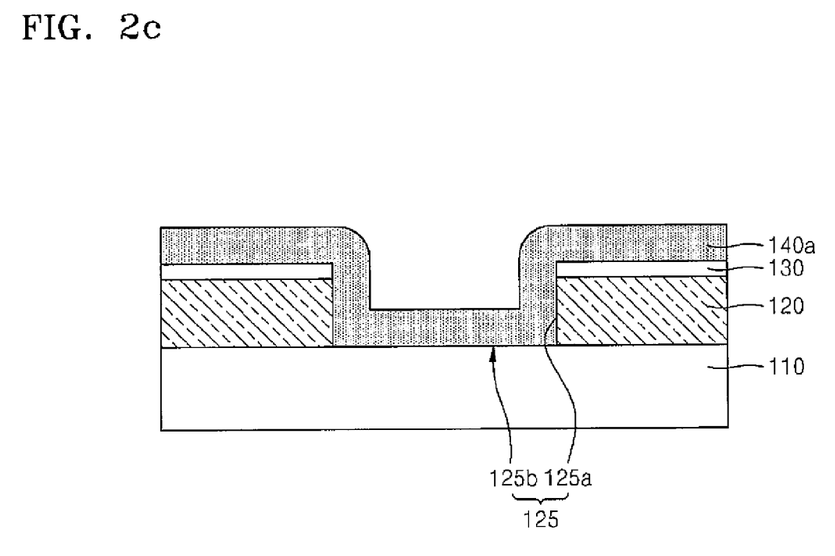

Referring to FIG. 2c, the preliminary second conductive type semiconductor layer 140a is formed on an entire surface of the substrate 110 to cover the first conductive type semiconductor layer 120. The preliminary second conductive type semiconductor layer 140a may be formed in the recess 125 and on the first conductive type semiconductor layer 120.

The preliminary second conductive type semiconductor layer 140a may be formed of amorphous silicon or crystalline silicon. The preliminary second conductive type semiconductor layer 140a may be formed by various methods known as compound semiconductor growth methods. For example, an epitaxial deposition method, an MOCVD method, an HVPE method, an MBE method, an MOVPE method, and/or an HCVD method may be used. The crystalline silicon may be formed by crystallizing the amorphous silicon.

When the preliminary second conductive type semiconductor layer 140a is formed, an in-situ doping operation for adding a second conductive type dopant may be performed concurrently (e.g., simultaneously). For example, a gas containing the second conductive type dopant may be injected into the semiconductor growth chamber while growing the preliminary second conductive type semiconductor layer 140a to perform the doping operation. A doping profile of the preliminary second conductive type semiconductor layer 140a may be adjusted according to conditions during the deposition process and/or during the in-situ doping process of the preliminary second conductive type semiconductor layer 140a.

The second conductive type is different from the first conductive type. The second conductive type may be the p-type or the n-type. The p-type dopant may include at least one selected from the group consisting of B, Al, Mg, Ca, Zn, Cd, Hg, and Ga, and the n-type dopant may include at least one selected from the group consisting of As and P.

Figure 2D:
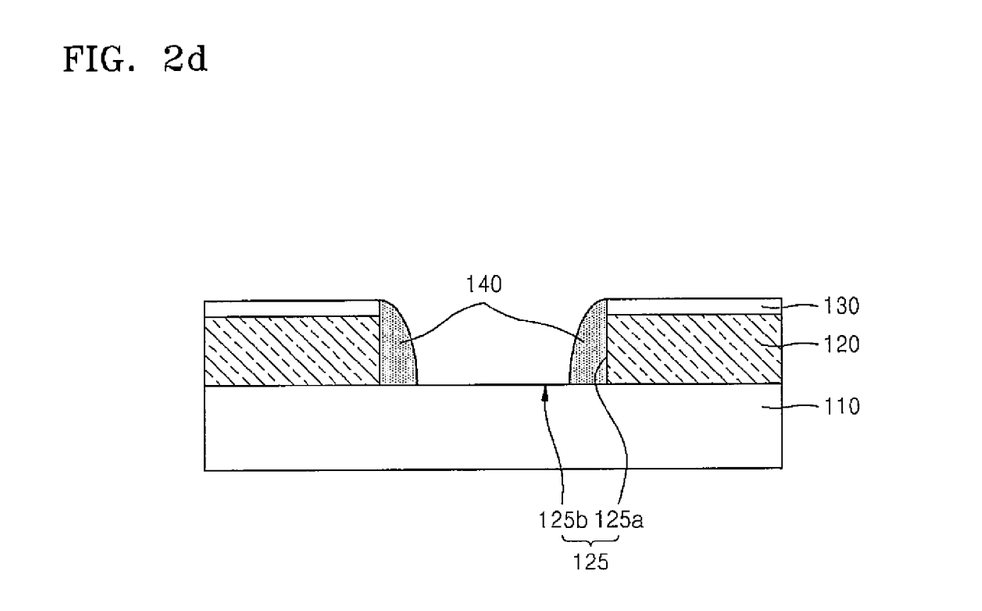

Referring to FIG. 2d, the preliminary second conductive type semiconductor layer 140a is etched to form the second conductive type spacers 140.

The second conductive type spacers 140 may be formed by dry-etching the preliminary second conductive type semiconductor layer 140a until the bottom face 125b of the recess 125 (e.g., a portion of the bottom face 125b) is exposed. Due to the dry etching process, the preliminary second conductive type semiconductor layer 140a may be etched anisotropically, that is, etched in a vertical direction. The etching is performed until the bottom face 125b of the recess 125 is exposed, and thus, parts (e.g., portions) of the preliminary second conductive type semiconductor layer 140a which are disposed on an upper surface of the first conductive type semiconductor layer 120 and at the center of the recess 125 are removed. Then, the second conductive type spacers 140 disposed at the side walls 125a in the recess 125 remain. In one embodiment, the etch stop layer 130 may function as an etch stopper.

The second conductive type spacers 140 may form the halo region. The halo region is a doped region disposed between the channel region and the source and drain regions and has a non-uniform doping profile along a side surface direction of the substrate (e.g., the second direction). The halo region reduces lateral diffusion of the dopant from the source and drain regions to the channel region so as to restrain or reduce a short-channel effect.

The doping profile may be adjusted according to the deposition conditions and/or the in-situ doping processing conditions of the preliminary second conductive type semiconductor layer 140a. In some embodiments, the doping profile shows the highest doping concentration at a portion of the second conductive type spacers 140 nearest the center of the recess 125 along the second direction, and then, the doping concentration is gradually reduced toward the edge of the second conductive type spacers 140.

Figure 2E:
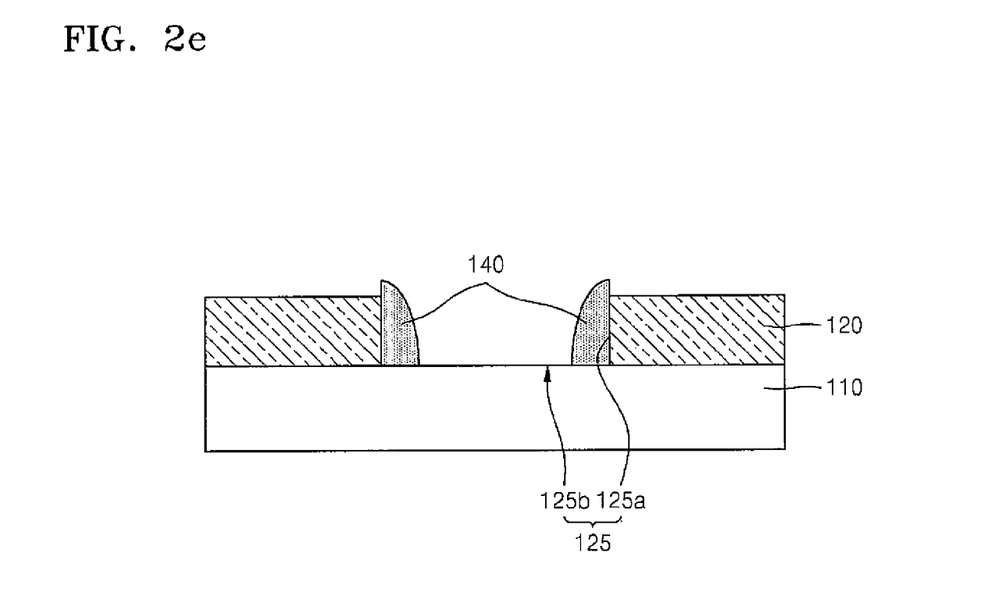

Referring to FIG. 2e, the etch stop layer 130 is removed. The etch stop layer 130 may be removed by an etching process. The etching process may be a dry etching process, a wet etching process, or a combination thereof.

Figure 2F:
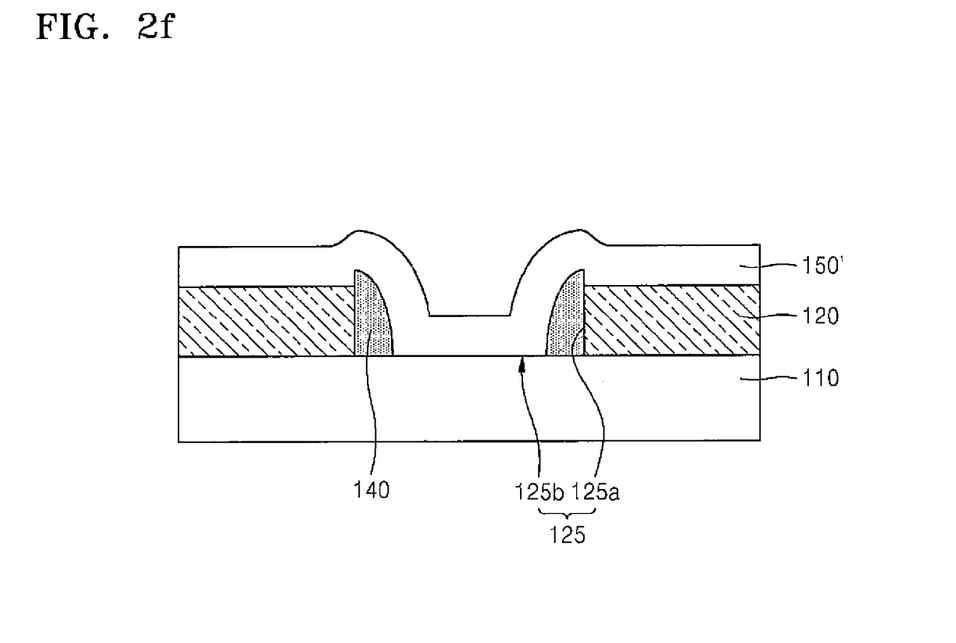

Referring to FIG. 2f, a preliminary main semiconductor layer 150' is formed to cover the first conductive type semiconductor layer 120 and the second conductive type spacers 140. The preliminary main semiconductor layer 150' may be formed to have a uniform or substantially uniform thickness. Accordingly, the preliminary main semiconductor layer 150' may be formed in the recess 125 and may be formed between the two second conductive type spacers 140. Also, the preliminary main semiconductor layer 150' may extend from the inside of the recess 125 to the upper surface of the first conductive type semiconductor layer 120.

The preliminary main semiconductor layer 150' may be formed of undoped amorphous silicon or crystalline silicon. The preliminary main semiconductor layer 150' may be formed by various methods known as compound semiconductor growth methods. For example, an epitaxial deposition method, an MOCVD method, an HVPE method, an MBE method, an MOVPE method, and/or an HCVD method may be used. The crystalline silicon may be formed by crystallizing the amorphous silicon.

Figure 2G:
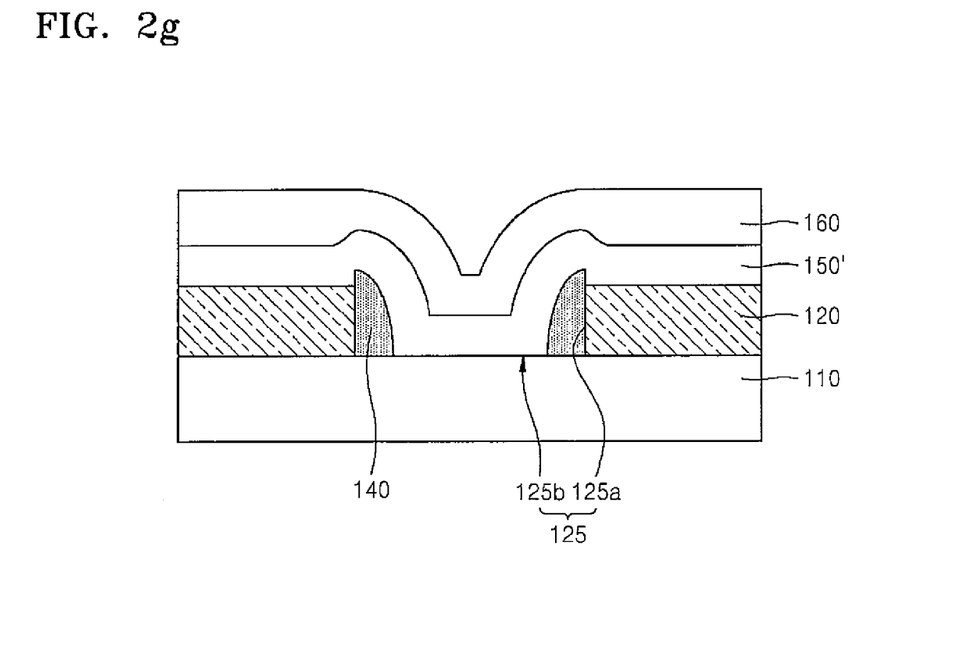

Referring to FIG. 2g, the gate insulating layer 160 is formed on the preliminary main semiconductor layer 150'. The gate insulating layer 160 may be formed according to (e.g., corresponding to) a shape of the preliminary main semiconductor layer 150'. Thus, a portion of the gate insulating layer 160 which corresponds to the recess 125 may not be flat, but depressed.

The gate insulating layer 160 may include a single-layer structure or a multi-layer structure including an inorganic insulating material. In some embodiments, the gate insulating layer 160 may be formed of $SiN_x$, $SiO_2$, $HfO_x$, or $AlO_x$. The gate insulating layer 160 may be formed by various deposition methods, for example, a sputtering method, a CVD method, or a PECVD method.

Figure 2H:
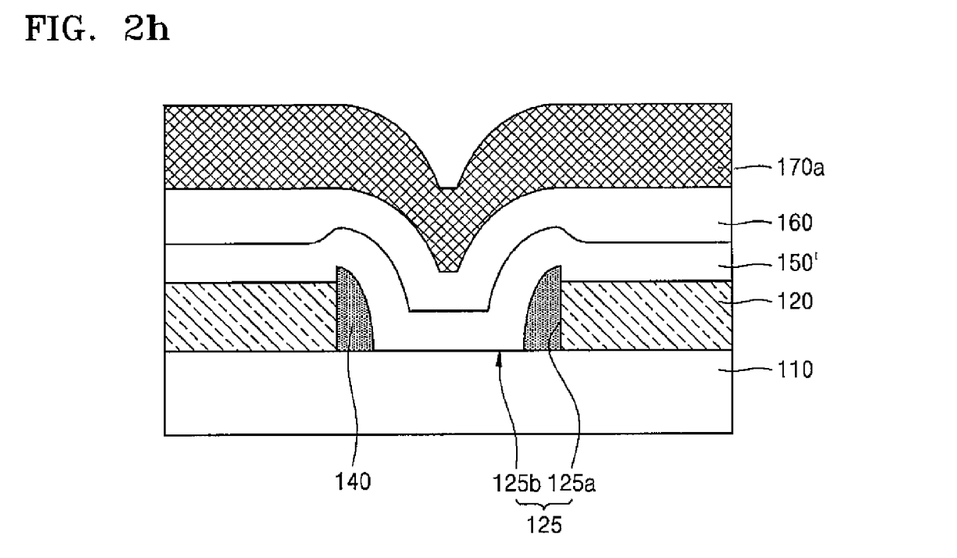

Referring to FIG. 2h, a preliminary gate electrode layer 170a is formed on the gate insulating layer 160. The preliminary gate electrode layer 170a may be formed according to (e.g., corresponding to) the shape of the gate insulating layer 160. Accordingly, a portion of the preliminary gate electrode layer 170a which corresponds to the recess 125 may not be flat, but depressed.

The preliminary gate electrode layer 170a may include a conductive material. For example, the preliminary gate electrode layer 170a may be formed of metal, a metal alloy, a conductive metal oxide, or a conductive metal nitride. The preliminary gate electrode layer 170a may be formed by various deposition methods, for example, a CVD method, a PECVD method, a low pressure CVD (LPCVD) method, a physical vapor deposition (PVD) method, a sputtering method, or an atomic layer deposition (ALD) method.

Figure 2I:
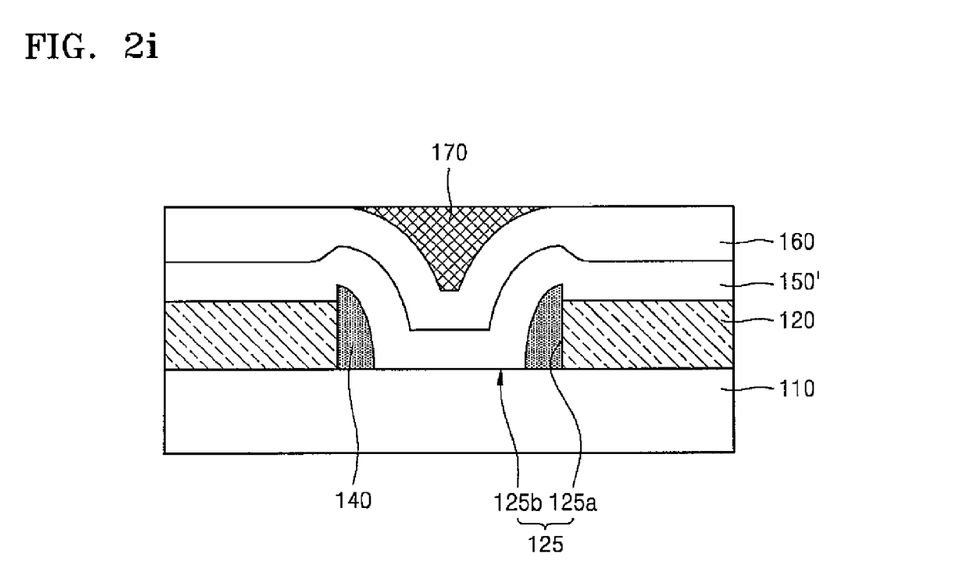

Referring to FIG. 2i, the preliminary gate electrode 170a is planarized to form the gate electrode 170.

Due to the planarization process, a part (e.g., a portion) of the gate insulating layer 160 is exposed, and the portion of the preliminary gate electrode layer 170a which corresponds to the recess 125 may remain to be formed as the gate electrode 170. In some embodiments, the planarization process may be performed by a chemical mechanical polishing (CMP) method.

Figure 2J:
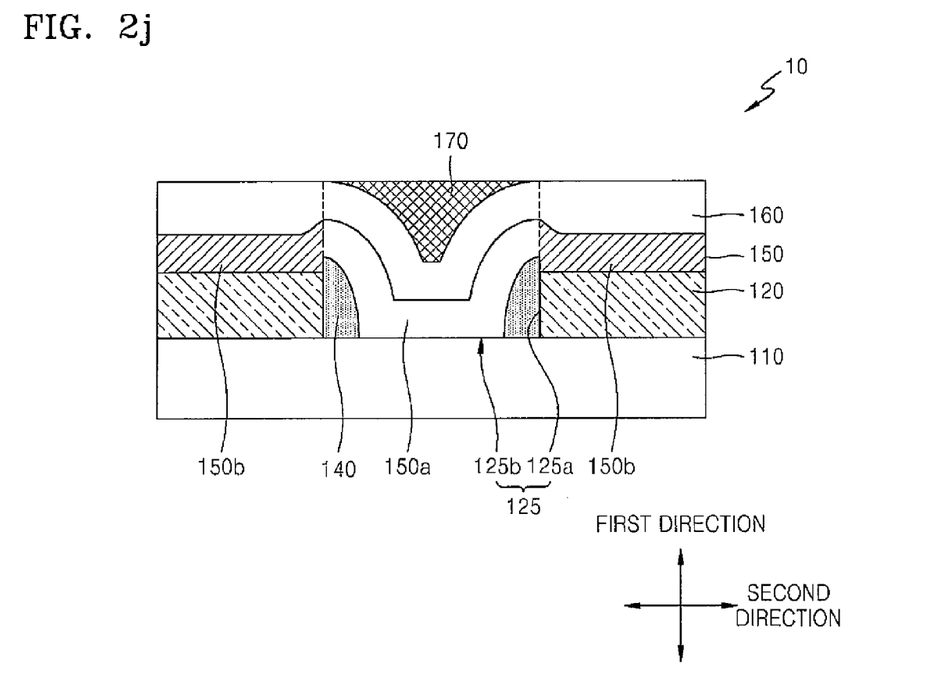

Referring to FIG. 2j, the dopant is added to the portion of the preliminary main semiconductor layer 150' disposed on the first conductive type semiconductor layer 120 to form the source and drain regions 150b. Accordingly, the main semiconductor layer 150 including the channel region 150a and the source and drain regions 150b is formed.

The source and drain regions 150b may be formed by ion implanting the first conductive type dopant by using the gate electrode 170 as a mask. The first conductive type dopant may be the p-type dopant or the n-type dopant. The p-type dopant may include at least one selected from the group consisting of B, Al, Mg, Ca, Zn, Cd, Hg, and Ga, and the n-type dopant may include at least one selected from the group consisting of As and P.

The source and drain regions 150b may have the same conductivity as that of the first conductive type semiconductor layer 120. Accordingly, the source and drain regions 150b may function as the source and drain of the TFT 10 including the first conductive type semiconductor layer 120.

Although not shown in the drawings, a source electrode or a drain electrode coupled to (e.g., connected to) the source and drain regions 150b may be additionally disposed on the gate insulating layer 160. In this case, the gate insulating layer 160 may have through-holes exposing some parts (e.g., portions) of the source and drain regions 150b, and the source and drain electrodes may be coupled to the source and drain regions 150b via the through-holes.

As described above, the TFT 10 according to one or more embodiments of the present invention may include the halo region due to the in-situ doping process. Also, because the TFT 10 has the recess 125 and includes the second conductive type spacers 140, the channel region 150a, and the gate electrode 170, the halo region may be self-aligned.

As described above, according to one or more of the above embodiments of the present invention, the halo region of the TFT may be formed by performing the in-situ doping process. In addition, the TFT has the recess so that the halo region, the channel region, and the gate electrode are self-aligned.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. A thin film transistor (TFT) comprising:
   a substrate;
   a first conductive type semiconductor layer on the substrate and having a recess;
   a plurality of second conductive type spacers at opposite side walls in the recess, the second conductive type being different from the first conductive type;
   a main semiconductor layer covering an upper surface of the first conductive type semiconductor layer and an upper surface of the second conductive type spacers, the main semiconductor layer comprising a channel region and source and drain regions;
   a gate insulating layer on the main semiconductor layer; and
   a gate electrode on the gate insulating layer and corresponding to the recess.

2. The TFT of claim 1, wherein the channel region is between the second conductive type spacers in the recess.

3. The TFT of claim 1, wherein the source and drain regions are on an upper surface of the first conductive type semiconductor layer.

4. The TFT of claim 1, wherein an upper surface of the gate electrode is at a level substantially equal to an upper surface of the gate insulating layer.

5. The TFT of claim 1, wherein a thickness of the gate electrode at a center portion of the recess is greater than the thickness of the gate electrode nearer the side walls of the recess.

6. The TFT of claim 1, wherein the second conductive type spacers form a halo region.

7. The TFT of claim 1, wherein the recess exposes a portion of the substrate.

8. A method of manufacturing a thin film transistor (TFT), the method comprising:
   forming a first conductive type semiconductor layer on a substrate, the first conductive type semiconductor layer having a recess;
   forming a plurality of second conductive type spacers on opposite side walls in the recess, the second conductive type being different from the first conductive type;
   forming a main semiconductor layer, after the formation of the second conductive type spacers, to cover the first conductive type semiconductor layer and the second conductive type spacers;
   forming a gate insulating layer on the main semiconductor layer; and
   forming a gate electrode on the gate insulating layer and corresponding to the recess.

9. The method of claim 8, wherein the forming of the second conductive spacers comprises:

forming a preliminary second conductive type semiconductor layer on an entire surface of the substrate to cover the first conductive semiconductor layer; and exposing a portion of a bottom face of the recess by dry etching the preliminary second conductive type semiconductor layer.

10. The method of claim 9, wherein the preliminary second conductive type semiconductor layer is doped with a second conductive type dopant during an in-situ doping process.

11. The method of claim 8, further comprising:

forming an etch stop layer on an upper surface of the first conductive type semiconductor layer; and removing the etch stop layer after forming the second conductive type spacers.

12. The method of claim 8, wherein the forming of the gate electrode comprises:

forming a preliminary gate electrode layer on the gate insulating layer; and planarizing the preliminary gate electrode layer to expose a portion of the gate insulating layer.

13. The method of claim 8, wherein the second conductive type spacers or the gate electrode are self-aligned by the recess.

14. The method of claim 8, wherein the main semiconductor layer comprises a channel region and source and drain regions, the channel region being formed in the recess, and the source and drain regions being formed on an upper surface of the first conductive type semiconductor layer.

15. The method of claim 14, wherein the source and drain regions are formed by implanting a first conductive type dopant into the main semiconductor layer by using the gate electrode as a mask.

16. The method of claim 8, wherein the main semiconductor layer is formed to cover an upper surface of the first conductive type semiconductor layer and an upper surface of the second conductive type spacers.

17. A method of manufacturing a thin film transistor (TFT), the method comprising:

forming a first conductive type semiconductor layer on a substrate, the first conductive type semiconductor layer having a recess;

forming a plurality of second conductive type spacers on opposite side walls in the recess, the second conductive type being different from the first conductive type;

forming a main semiconductor layer to cover the first conductive type semiconductor layer and the second conductive type spacers;

forming a gate insulating layer on the main semiconductor layer; and forming a gate electrode on the gate insulating layer and corresponding to the recess, wherein the forming of the first conductive type semiconductor layer comprises:

forming a preliminary first conductive type semiconductor layer while performing an in-situ doping process adding a first conductive type dopant; and forming the recess in the preliminary first conductive type semiconductor layer.

* * * * *